United States Patent [19]
Cremonese

[11] 3,977,909
[45] Aug. 31, 1976

[54] SOLAR HEAT ENERGY CONVERSION SYSTEM
[76] Inventor: Otto A. Cremonese, 3010 Perry Ave., Tampa, Fla. 32304
[22] Filed: Mar. 18, 1974
[21] Appl. No.: 451,797

[52] U.S. Cl. .............................. 136/206; 136/223
[51] Int. Cl.² ....................................... H01L 35/00
[58] Field of Search ........................... 136/206, 223

[56] References Cited
OTHER PUBLICATIONS
Proc. 15th Annual Power Sources Conference, Aug. 1961, T.J.153P6; *Cryogenic Fueled Thermoelectric Generators*, by J. Angello & W. Shorr; pp. 134–139.
Electro–technology, vol. 68, No. 2; Aug. 1961, *Unconventional Power Sources* by Eric Randall; pp. 54–62.

Primary Examiner—Verlin R. Pendegrass
Attorney, Agent, or Firm—Arthur W. Fisher, III

[57] ABSTRACT
A self-sustaining solar energy conversion system for converting solar heat energy to electrical energy comprising a finite heat sink having a first heat exchange means and drive means disposed therein. The finite heat sink comprises an enclosure having a thermopile formed in the side walls thereof wherein the cold junctions are arranged to communicate with the interior of the finite heat sink and the hot junctions are arranged to communicate with the exterior surrounding infinite heat sink. The first heat exchange is coupled to an external liquid gas supply to cool the interior of the finite heat sink and cold junctions. The drive means is electrically coupled to the thermopile and mechanically coupled to an electrical generator means disposed externally of the finite heat sink such that the electrical energy derived from the thermopile is used to electrically power the drive means which, in turn, is used to mechanically drive the electrical generator means to generate an electrical output of the system. A portion of the electricity from the electric generator means may be utilized to energize the liquid gas generator means to maintain the temperature differential between the cooled finite heat sink and the ambient temperature infinite heat sink while the remainder of the electricity from the electrical generator means is available for external use.

8 Claims, 1 Drawing Figure

SOLAR HEAT ENERGY CONVERSION SYSTEM

BACKGROUND OF THE INVENTION

Field of the Invention

A self-sustaining solar energy conversion apparatus for converting solar heat energy to electrical energy including a cooled finite heat sink comprising an enclosure having a thermopile formed in the side walls thereof to generate electricity therefrom and a drive means/generator means combination to convert the electricity to mechanical energy within the cooled finite heat sink and reconvert the mechanical energy to electrical energy externally of the cooled finite heat sink.

Description of the Prior Art

From the earliest days of man a seemingly infinite number of variations have been developed to convert one form of energy to another. The more practical and better known means is the use of hydrocarbons such as petroleum, coal and natural gas which are used either directly to generate useful heat, light or mechanical energy or indirectly to generate electricity for further use. Supplies of the necessary hydrocarbons are fast dwindling. Also hydro power is widely used to generate electrical energy. Unfortunately, the geographic availability of adequate hydro power is severly limited. Of course, the use of transmission lines to supply generated electrical energy is inefficient and costly. More recently, nuclear energy has been employed to develop other useful forms of energy. Again, the supply of raw materials is limited and expensive to produce. In addition, the potential by-products are often ecologically harmful.

Attempts have also been made to convert direct solar energy to the other useful forms of energy. Unfortunately, most such devices are not useful in many climates and subject to seasonal weather conditions in those geographic areas that are suitable for any use at all.

In some applications of energy conversion, thermocouples are used to convert heat energy to electrical energy. In such applications, the hot junction is heated by some source, such as the sun's rays or by some artificial heat source. The cold junction is left at ambient temperature. It is well known, however, that such high temperature thermopiles are inefficient due to the high resistance resulting from high temperature hot junctions. As discussed above, such devices either require the use of consumable forms of energy much as hydrocarbons or high level solar energy which is very restricted in availability.

It can thus plainly be seen that a real need exists for an efficient energy conversion system capable of using available low level solar heat energy.

SUMMARY OF THE INVENTION

This invention relates to a self-sustaining solar energy conversion system for converting solar heat energy to electrical energy. More specifically, the solar energy conversion system comprises a finite heat sink having a first heat exchange means and drive means disposed therein. Disposed externally to the finite heat sink are a liquid gas generator means and an electric generator means which are operatively coupled to the first heat exchange means and drive means respectively.

The finite heat sink comprises an enclosure having a thermopile formed in the side walls thereof. The thermopile comprises a plurality of thermocouples disposed with the side walls having their cold junction in communication with the interior of the finite heat sink and their hot junctions in communication with the exterior of the finite heat sink. Since the first heat exchange is coupled to the liquid gas generator means, the interior of the finite heat sink is maintained at a sub-zero temperature. The resultant temperature difference between the hot junctions at the external atmospheric ambient temperature and the cold junctions at the cooled temperature of the finite heat sink generates electrical energy across the thermopile.

The electrical output of the thermopile is fed directly to the drive means which may comprise a direct current motor or the like. Since the D.C. motor is disposed within the cooled finite heat sink, the efficiency of the motor is increased due to the increased influence of the magnetic flux. As previously discussed, the drive means is coupled to the electric generator means. The drive means and electrical generator means are mechanically interconnected by a pair of rigid rotatably mounted shafts operatively engaging one another by a coupling means. To reduce wear and enhance efficiency each shaft is mounted on a system of support bearings.

The electric generator means may comprise an alternating current generator or the like which, when driven by the drive motor will generate an A.C. output. A portion of the electrical output may be fed to the liquid gas generator means to generate and supply the liquid gas to the first heat exchange means to maintain the temperature differential between the cooled finite heat sink and the ambient temperature infinite heat sink. The remainder or excess of electrical energy generated by the A.C. generator is made available for use externally to the system. Alternately, the liquid gas generator means may be driven by an external means.

In this manner, the electrical energy generated by the thermopile is efficiently converted to mechanical energy and reconverted to electrical energy to maintain a self-sustaining thermopile electrical energy source with excess electrical energy to power and drive external devices.

The invention accordingly comprises the features of construction, combination of elements and arrangement of parts which will be exemplified in the construction hereinafter set forth, and the scope of the invention will be indicate in the claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
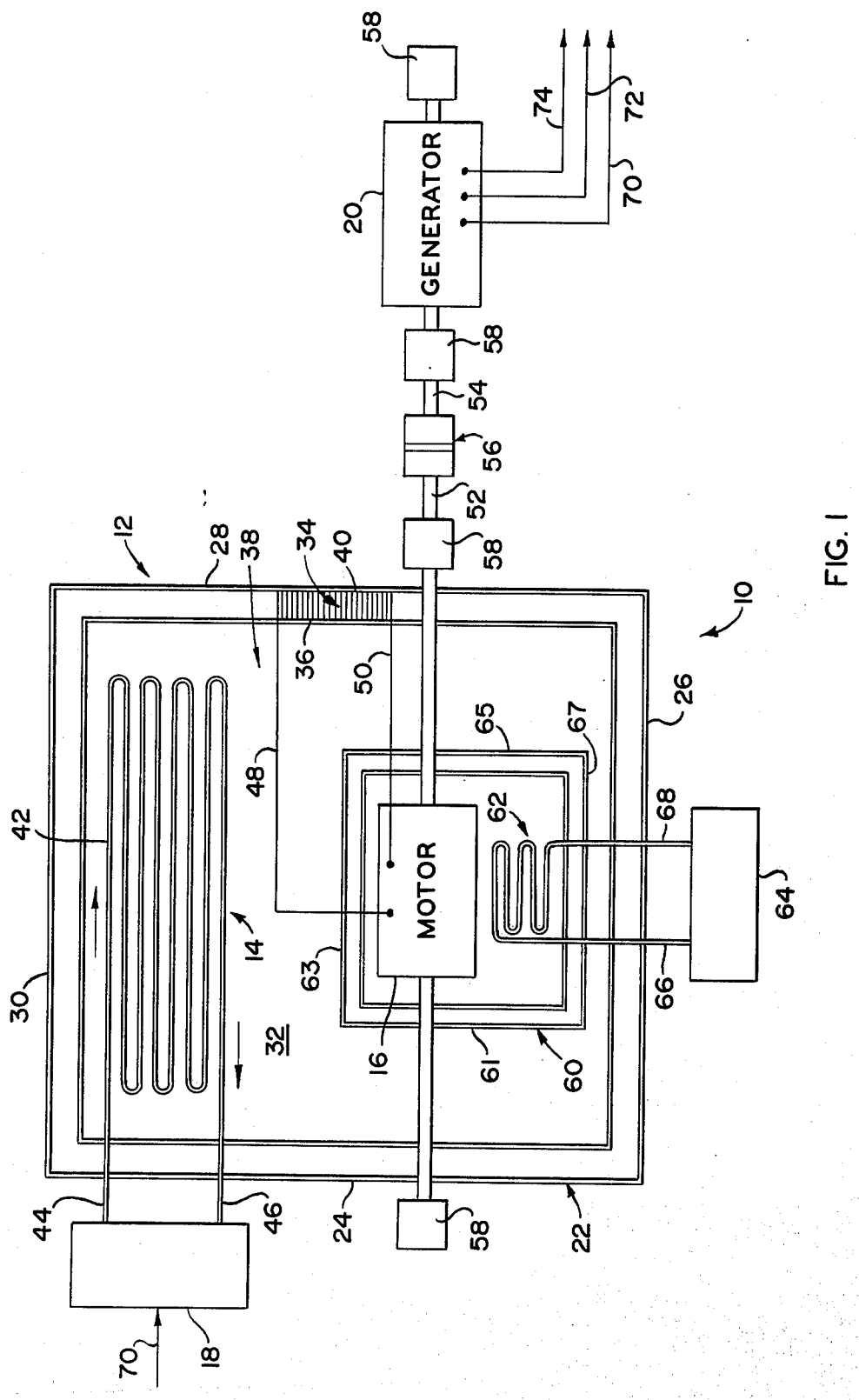
FIG. 1 is a block diagram schematic of a self-sustaining solar energy conversion system.

As shown in FIG. 1, the present invention relates to a self-sustaining solar energy conversion system generally indicated as 10. The solar energy conversion system 10 comprises a finite heat sink 12 having first heat exchange means 14 and a drive means 16. Disposed externally to the finite heat sink 12 are a liquid gas generator means 18 and an electric generator means 20.

As shown, the finite heat sink 12 comprises an enclosure 22 including side walls 24, 26, 28 and 30 and top (not shown) and bottom walls 32. The side walls 24, 26, 28 and 30 each include an inner and outer surface spaced apart relative to each other to cooperatively form a void or space therebetween. The void itself may form a vacuum to insulate or other suitable insulating material may be disposed therein. At least a portion of the side walls 24, 26, 28 and 30 include a thermopile 34 including a plurality of thermocouples extending between the inner and outer surfaces. As disclosed, the cold junctions 36 communicate with the interior chamber 38 of the finite heat sink 12 and the hot junctions 40 communicate with the exterior of the finite heat sink 12. Of course, the thermocouples can be coupled in series or parallel to attain a combination of both voltage and amperage required.

The first heat exchange means 14 comprises a sinuous conduit 42 having an inlet and outlet 44 and 46 respectively operatively coupled to the liquid gas generator means 18. The liquid gas generator means 18 may comprise any suitable means for liquifying nitrogen (to −300°F) or similar gases. The cooled gas is fed from the liquid gas generator means 18 to the first heat exchange means 14 through inlet 44 circulated through conduit 42 and returned to the liquid gas generator means 18 through outlet 46. Since the liquified gas is recirculated through the first heat exchange 14, the interior 38 of the finite heat sink 12 is maintained at a sub zero temperature. The resultant temperature difference between the hot junctions 40 at the external atmospheric ambient temperature and the cold junctions 36 at the sub zero temperature of the finite heat sink 12 generates electrical energy across the thermopile 34.

The drive means 16 comprises a direct current motor or other suitable means to convert electrical energy to mechanical energy. The D.C. motor is electrically coupled to the thermopile 34 through conductors 48 and 50 to activate the motor. Since the D.C. motor is disposed within the cooled finite heat sink 12, the efficiency of the motor is increased due to the increased influence of the magnetic flux. As previously discussed, the drive means 16 is mechanically coupled to the electric generator means 20. The mechanical coupling comprises a first and second shaft 52 and 54 respectively, operatively attached to the drive means 16 and electric generator means 20 respectively. First and second shafts 52 and 54 respectively are operatively coupled to each other by coupling means 56. To reduce wear and enhance efficiency each shaft 52 and 54 is rotatably mounted on a system of support bearings 58.

The electric generator means 20 comprises an alternating current generator or other suitable means to convert mechanical energy to electrical energy. As shown, the system 10 may include a second finite heat sink 60 within the interior 38 of first finite heat sink 12. The second finite heat sink 60 is super cooled by a second heat exchange means 62 disposed therein which is coupled to a liquid hydrogen generator means 64 by conduits 66 and 68. As a result of the super cooled temperature within the second finite heat sink, the magnetic flux within the motor coils (not shown) is greatly increased as well as causing the motor 16 to be super conducting to eliminate electrical resistance thereby increasing the efficiency and output of the system 10. The second finite heat sink 60 comprises a second enclosure including walls 61, 63, 65 and 67, each having an iner and outer spaced apart surface to cooperatively form a vacuum therebetween.

In operation, a portion of the electrical output of the electric generator means 20 may be fed to the liquid gas generator means 18 through conductor 70 to generate and supply the liquid gas to the first heat exchange means 14 to maintain the temperature differential between the cooled finite heat sink 12 and the ambient temperature infinite heat sink. The remainder or excess of electrical energy generated by the electric generator means 20 is available for use external to the system 10 through conductors 72 and 74. Of course, any suitable number of conductors may be used. Of course, the liquid gas generator means 18 may be coupled to an external power source to generate the liquid gas.

When the second super cooled heat sink 60 is used, the second finite heat sink 60 is super cooled by hydrogen from the liquid hydrogen generator means 64. The liquid hydrogen generator means 64 may also be driven by the electric generator means 20 or an external source. It is envisioned that both the liquid gas generator means 18 and liquid hydrogen generator means 64 are replenishable from an external source. Alternately these generators can be driven by external means to provide the necessary liquid gas. It is expected that due to the present state of the art, continuous feedback from generator 20 to the liquid gas generators 18 and 64 would eventually deplete the liquid gas source.

Because of the low temperatures involved in this process, the coefficient of utilization in the electrical circuit of the system 10 is high. This is attributable in large measure to the progressive reduction of the electrical resistance in the thermopile 34 as the temperature is reduced within first finite heat sink 12. Additional advantages result from the fact that the system 10 may be located at the site of use obviating the necessity of lengthy transmission lines. Moreover, no hydrocarbon or nuclear energy source is required.

In this manner the electrical energy generated by the thermopile 34 is efficiently converted to mechanical energy by the drive means 16 and reconverted to electrical energy by the generator means 20 to maintain a self-sustaining thermopile electrical energy source with excess electrical energy to power and drive external devices.

It will thus be seen that the objects made apparent from the preceding description, are efficiently attained, and since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described, what is claimed is:

1. A solar energy conversion system for converting thermal energy to electrical energy, said conversion system comprising a first finite heat sink defining an enclosure including walls having an interior chamber formed thereby, a first heat exchange means disposed within said first finite heat sink, said first heat exchange means coupled to a first cryogenic liquid gas source to cool said interior chamber, direct current motor disposed within said interior chamber, said walls of said first finite heat sink including a thermopile formed therein, said walls comprise a vacuum to maintain said interior chamber at a cryogenic temperature, said direct current motor coupled to said thermopile to receive electric energy therefrom, and an electric generator means disposed externally of said interior chamber, said electric generator means and said direct current motor interconnected by internecting means, said direct current motor electrically coupled to said thermopile and mechanically coupled to said electrical generator means disposed externally of said first finite heat sink such that electrical energy derived from said thermopile power said direct current motor and said direct current motor converts the electricity to mechanical energy to drive said electric generator means to generate electric energy.

2. The solar energy conversion system of claim 1 wherein said drive means comprises a DC motor to convert electrical energy from said thermopile to mechanical energy.

3. The solar energy conversion system of claim 2 wherein said electric generator means comprises an AC generator means to convert said mechanical energy from said DC motor to electrical energy.

4. The solar energy conversion system of claim 3 wherein said interconnecting means comprises a first and second shaft coupled to said drive means and said electrical generator means respectively, said first and second shaft interconnected by coupling means to translate the mechanical energy from said drive means to said electrical generator means.

5. The solar energy conversion system of claim 1 wherein said enclosure comprises a double wall configuration, said double wall configuration comprising a vacuum.

6. The solar energy conversion system of claim 1 wherein said thermopile comprises a plurality of thermal couples, the cold junction of said thermal couples in communication with the interior of said first finite heat sink and the hot junctions of said thermal couples disposed to communicate with the exterior of said first finite heat sink.

7. The solar energy conversion system of claim 1 further including a second finite heat sink comprising an enclosure surrounding said direct current motor having a second heat exchange means disposed therein, said second heat exchange means operatively coupled to a second cryogenic liquid gas source to cool said second finite heat sink means to a cryogenic second temperature.

8. The solar energy conversion system of claim 1 wherein the output of said electrical generating means is coupled to said first liquid source to maintain the liquid gas at the temperature differential between said first finite heat sink and the ambient temperature of the surrounding atmosphere.

* * * * *